(12) United States Patent
Kang

(10) Patent No.: US 9,905,281 B2
(45) Date of Patent: Feb. 27, 2018

(54) DATA INPUT/OUTPUT CIRCUIT AND SEMICONDUCTOR MEMORY DEVICE HAVING THE SAME

(71) Applicant: SK hynix Inc., Icheon-si Gyeonggi-do (KR)

(72) Inventor: Yong Gu Kang, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/291,556

(22) Filed: Oct. 12, 2016

(65) Prior Publication Data
US 2017/0323674 A1 Nov. 9, 2017

(30) Foreign Application Priority Data

May 3, 2016 (KR) .................. 10-2016-0054848

(51) Int. Cl.
G11C 7/22 (2006.01)
G11C 7/10 (2006.01)
G11C 8/10 (2006.01)
G11C 7/12 (2006.01)

(52) U.S. Cl.
CPC .............. G11C 7/222 (2013.01); G11C 7/10 (2013.01); G11C 7/12 (2013.01); G11C 8/10 (2013.01)

(58) Field of Classification Search
CPC ....... G11C 7/10; G11C 7/1051; G11C 7/1078; G11C 7/22

USPC ..... 365/189.05, 189.04, 189.01, 230.06, 193
See application file for complete search history.

(56) References Cited

U.S. PATENT DOCUMENTS

| | | | | |
|---|---|---|---|---|
| 2011/0103156 A1* | 5/2011 | Kim, II | ............... | G11C 7/1006 365/189.05 |
| 2011/0280090 A1* | 11/2011 | Matsubara | ............. | G11C 29/08 365/193 |
| 2017/0011787 A1* | 1/2017 | Kang | ...................... | G11C 7/12 |
| 2017/0098477 A1* | 4/2017 | Kim | .................. | G11C 29/1201 |

FOREIGN PATENT DOCUMENTS

| | | |
|---|---|---|
| KR | 1020080020347 A | 3/2008 |
| KR | 1020090114617 A | 11/2009 |
| KR | 1020150104333 A | 9/2015 |

* cited by examiner

*Primary Examiner* — Connie Yoha
(74) *Attorney, Agent, or Firm* — William Park & Associates Ltd.

(57) ABSTRACT

Provided herein are a data input/output circuit and a semiconductor memory system having the same. The data input/output circuit may be coupled to an input/output line. The data input/output circuit may include a data input unit and a data output unit. The data input unit may deliver input data, inputted through the input/output line, to a page buffer during a data input period. The data output unit may deliver output data, outputted from the page buffer, to the input/output line during a data output period. The data input unit may include a signal reception unit coupled to the input/output line and configured to receive the input data from the input/output line; and a data delivery unit configured to deliver the input data inputted to the signal reception unit to the page buffer during the data input period.

20 Claims, 10 Drawing Sheets

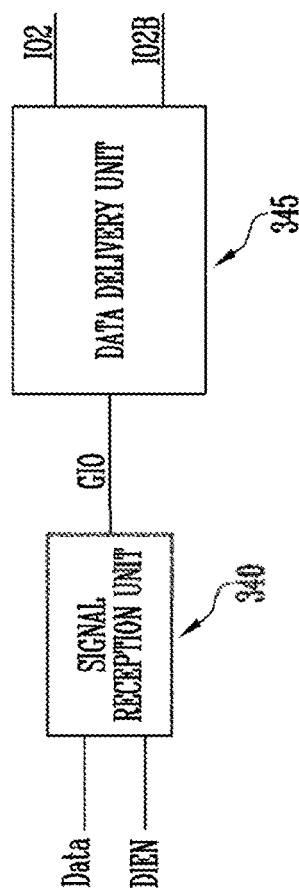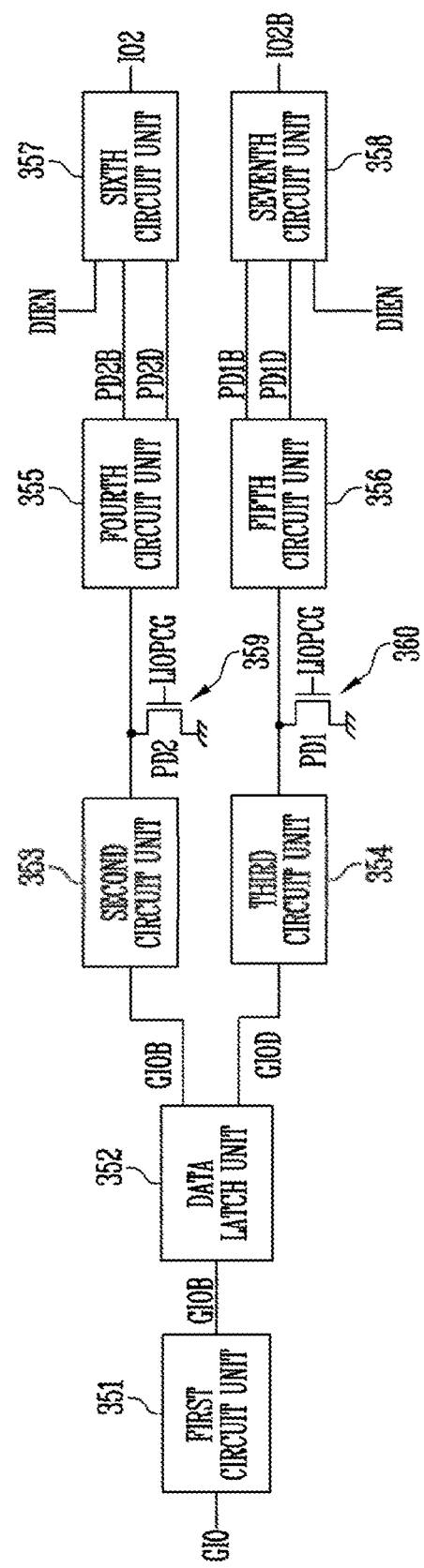

DATA INPUT/OUTPUT CIRCUIT AND SEMICONDUCTOR MEMORY DEVICE HAVING THE SAME

CROSS-REFERENCE TO RELATED APPLICATION

The present application claims priority to Korean patent application number 10-2016-0054848 filed on May 3, 2016 the entire disclosure of which is incorporated herein in its entirety by reference.

BACKGROUND

Field of Invention

Various embodiments of the present disclosure may generally relate to a data input/output circuit and a semiconductor memory device having the data input/output circuit.

Description of Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of the volatile memory device include a static RAM (SRAM), a dynamic RAM (DRAM), a synchronous DRAM (SDRAM), etc. The nonvolatile memory device is a memory device in which data stored therein is maintained even when power is turned off. Representative examples of the nonvolatile memory devices include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

An embodiment of the present disclosure may provide a semiconductor memory system. An embodiment of the present disclosure may provide a data input/output circuit. The data input/output circuit may be coupled to an input/output line. The data input/output circuit may include a data input unit and a data output unit. The data input unit may deliver input data, inputted through the input/output line, to a page buffer during a data input period. The data output unit may deliver output data, outputted from the page buffer, to the input/output line during a data output period. The data input unit may include a signal reception unit coupled to the input/output line and configured to receive the input data from the input/output line; and a data delivery unit configured to deliver the input data inputted to the signal reception unit to the page buffer during the data input period.

BRIEF DESCRIPTION OF THE DRAWINGS

FIG. 4 is a block diagram illustrating the data input unit of FIG. 3.

FIG. 5 is a block diagram illustrating the data delivery unit of FIG. 4.

DETAILED DESCRIPTION

Figure 1:
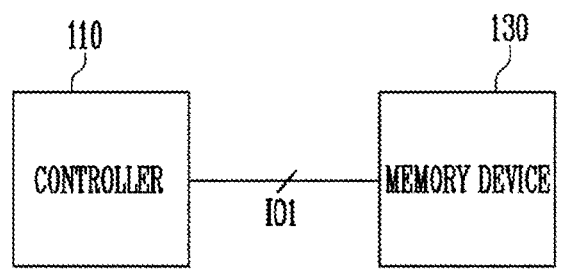
FIG. 1 is a block diagram illustrating a memory system including a controller and a memory device.

Hereinafter, embodiments will be described below with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a data input/output circuit, which may reduce power consumption.

various embodiments of the present disclosure may be directed to a semiconductor memory device, which may reduce power consumption.

FIG. 1 is a block diagram illustrating a memory system including a controller and a memory device. Referring to FIG. 1, the memory system includes a controller 110 and a memory device 130.

Although not illustrated in FIG. 1, the controller 110 may be coupled to a host (not illustrated). The controller 110 is configured to access the memory device 130 in response to a request from the host. For example, the controller 110 is configured to control the read, write, erase and background operations of the memory device 130. The controller 110 is configured to provide an interface between the memory device 130 and the host. The controller 110 may be configured to run firmware required to control the memory device 130.

Although not illustrated in FIG. 1, the controller 110 may include a RAM (Random Access Memory), a processing unit, a host interface, a memory interface, and an error correction block.

The RAM of the controller 110 may be used as at least one of an operation memory of the processing unit, a cache memory between the memory device 130 and the host, and a buffer memory between the memory device 130 and the host. The processing unit controls the overall operation of the controller 110.

The host interface of the controller 110 includes a protocol required to perform data exchange between the host and the controller 110. In an embodiment, the controller 110 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface of the controller 110 interfaces with the memory device 130, via input/output (input and output) (I/O) lines IO1. For example, the memory interface includes a NAND interface or a NOR interface.

The error correction block of the controller 110 is configured to detect and correct error in the data received from the memory device 130 using an Error Correcting Code (ECC).

The controller 110 and the memory device 130 may be integrated into a single semiconductor device. In an example of an embodiment, the controller 110 and the memory device 130 may be integrated into a single semiconductor device to form a memory card. For example, the controller 110 and the memory device 130 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 110 and the memory device 130 may be integrated into a single semiconductor device to form a solid state drive (SSD). The SSD includes a storage device formed to store data in a semiconductor memory. When the memory system is used as the SSD, an operation speed of the host coupled to the memory system may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

As an embodiment, the memory device 130 or the memory system may be mounted in various types of packages. For example the memory device 130 or the memory system 1000 may be embedded in various types of packages. For example, the semiconductor memory device 100 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 2:
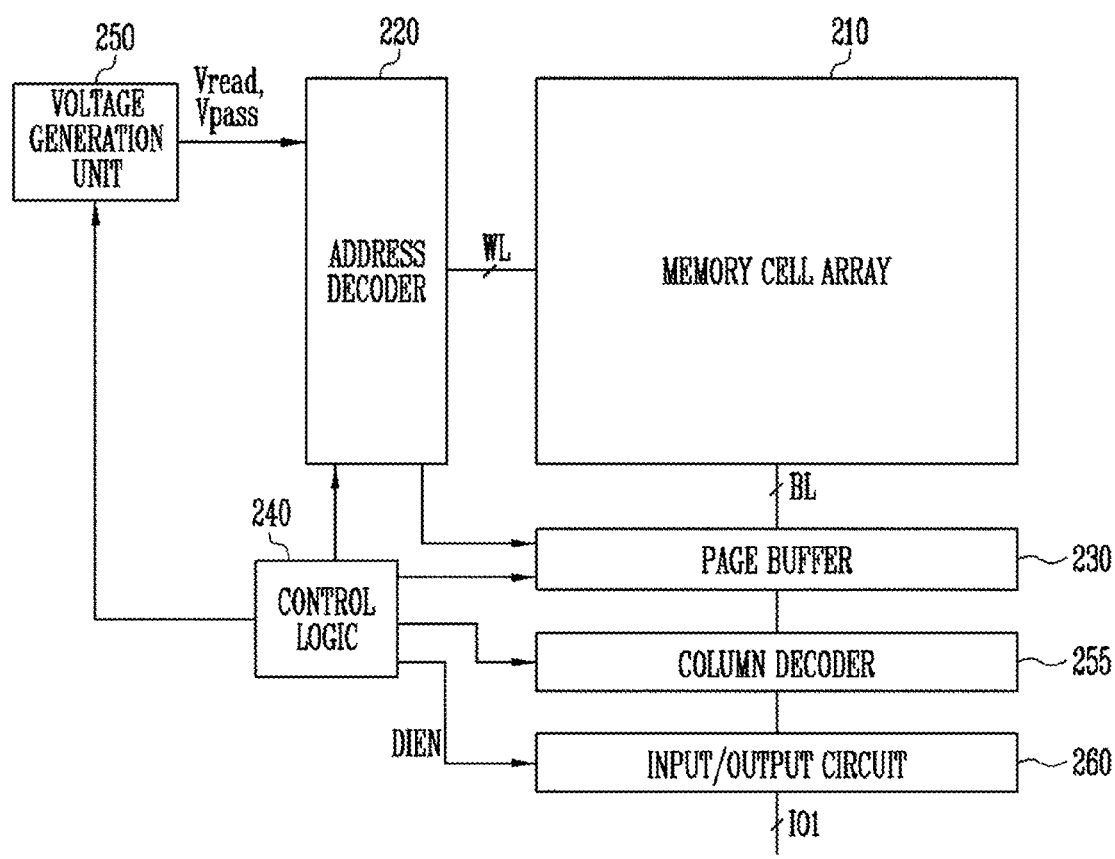
FIG. 2 is a block diagram illustrating a semiconductor memory device according to an embodiment of the present disclosure.

FIG. 2 is a block diagram illustrating a semiconductor memory device according to an embodiment of the present disclosure. The semiconductor memory device illustrated in FIG. 2 may indicate the same device as the memory device 130 illustrated in FIG. 1.

Referring to FIG. 2, the semiconductor memory device includes a memory cell array 210, an address decoder 220, a page buffer 230, control logic 240, a voltage generation unit 250, a column decoder 255, and a data input/output circuit 260.

Although not illustrated in FIG. 2, the memory cell array 210 may include a plurality of memory blocks. The memory blocks are coupled to the address decoder 220 through word lines WL. The plurality of memory blocks are coupled to the page buffer 230 through bit lines BL. Each of the memory blocks includes a plurality of memory cells. In an embodiment, the plurality of memory cells are volatile memory cells, and may be implemented as nonvolatile memory cells having a vertical channel structure.

The address decoder 220, the page buffer 230, the control logic 240, and the data input/output circuit 260 function as peripherals for driving the memory cell array 210.

The address decoder 220 is coupled to the memory cell array 210 through the word lines WL. The address decoder 220 is configured to be operated in response to the control of the control logic 240. The address decoder 220 may receive addresses through an input/output buffer (not illustrated) in the semiconductor memory device.

The address decoder 220 is configured to decode a block address among the received addresses. The address decoder 220 selects at least one memory block in response to the decoded block address. Further, the address decoder 220 applies a read voltage Vread generated by the voltage generation unit 250 to a selected word line of a selected memory block during the read voltage application operation of a read operation, and applies a pass voltage Vpass to the remaining unselected word lines. Furthermore, during a program verification operation, the address decoder 220 applies a verification voltage generated by the voltage generation unit 250 to a selected word line of a selected memory block, and applies a pass voltage Vpass to the remaining unselected word lines.

The column decoder 255 is configured to decode a column address among the received addresses. The column decoder 255 transmits the decoded column address to the page buffer 230.

The read operation and program operation of the semiconductor memory device are performed on a page basis. Addresses received in response to a read operation and program operation request include a block address, a row address, and a column address. The address decoder 220 selects one memory block and one word line based on the block address and the row address. The column address is decoded by the column decoder 255 and is provided to the page buffer 230.

The address decoder 220 may include a block decoder, a row decoder, an address buffer, etc. Referring to FIG. 2, the column decoder 255 is depicted to be separated from the address decoder 220. In an embodiment, the column decode may be included or integrated to the address decoder 220.

The page buffer 230 is coupled to the memory cell array 210 through bit lines BL. The page buffers 230 senses a change in the amount of current flowing depending on the program state of the corresponding memory cell through the sensing node and latches the sensed current change as sensed data while continuing to supply a sensing current to bit lines connected to memory cells in order to sense the threshold voltages of memory cells during a read operation and a program verification operation.

The page buffer 230 is operated in response to page buffer control signals outputted from the control logic 240.

The page buffer 230 senses data from the memory cells in a read operation, temporarily stores the read data, and then outputs the read data as data DATA to the data input/output circuit 260.

The control logic 240 is coupled to the address decoder 220, the page buffer 230, the voltage generation unit 250, the column decoder 250, and the data input/output circuit 260. The control logic 240 may receive a command CMD and a control signal CTRL. The control logic 240 is configured to control the overall operation of the semiconductor memory device in response to the control signal CTRL.

The voltage generation unit 250 may generate a read voltage Vread and a pass voltage Vpass during a read operation in response to a voltage generation unit control signal outputted from the control logic 240.

The data input/output circuit 260 is coupled to the column decoder 255 and is configured to output the latched sensed data through input/output (I/O) lines IO1, or deliver the data inputted through the I/O lines IO1 to the page buffer 230. For example, the data input/output circuit 260 may output the output data, received from the page buffer 230 via the column decoder 255 during a data output period, to the I/O lines IO1. The data input/output circuit 260 may deliver the input data, received from the I/O lines IO1 during a data input period, to the page buffer 230 via the column decoder 255. The I/O lines IO1 illustrated in FIG. 2 may include a plurality of lines. For example, in an embodiment, the I/O lines IO1 may include 8 lines. The data input/output circuit 260 may receive a data enable signal DIEN from the control logic 240. The data input/output circuit 260 may be operated based on the received data enable signal. Although not illustrated in FIG. 2, the data input/output circuit 260 may include a data input unit for delivering input data, inputted through the I/O lines IO1, to the page buffer 230 during a data input period, and a data output unit for delivering the output data, outputted from the data page buffer 230, to the I/O lines IO1. In accordance with the data input/output circuit 260 according to an embodiment of the present disclosure, a signal reception unit in the data input unit outputs a constant voltage value regardless of the output data appearing on the I/O lines IO1 during the data output period. Therefore, the amount of current flowing into the data input unit is reduced, and thus power consumption may also be reduced.

Figure 3:
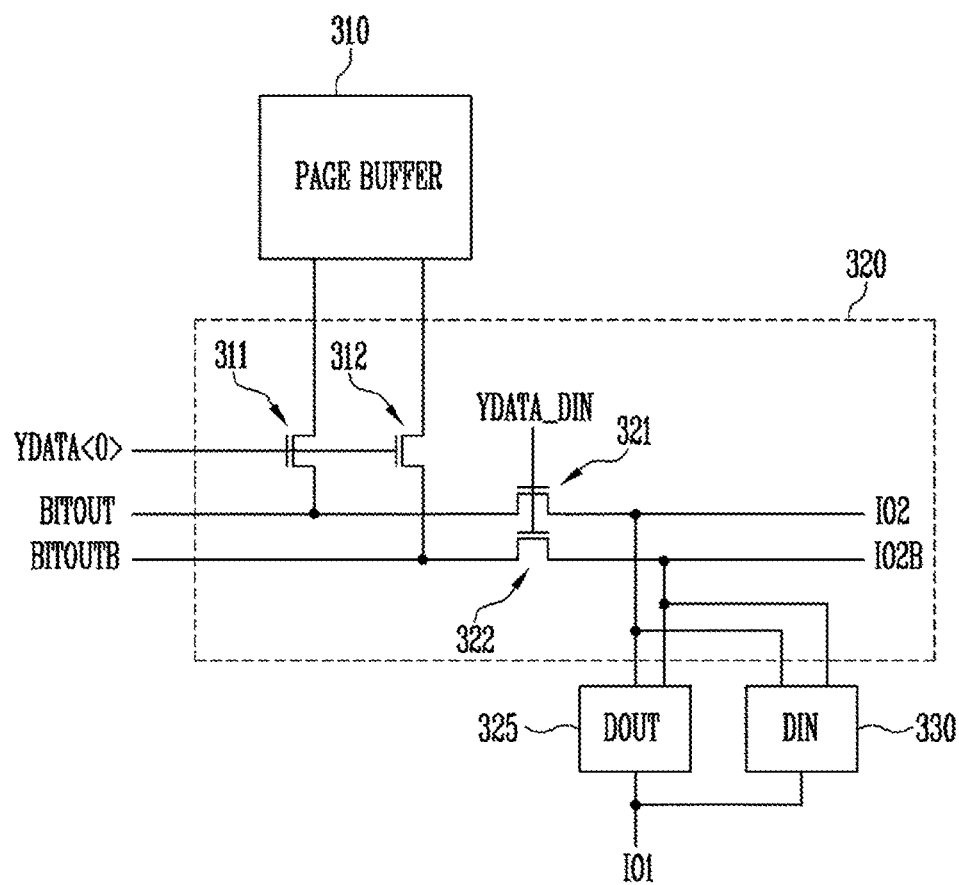
FIG. 3 is a block diagram illustrating a connection between the page buffer, column decoder, and a data input/output circuit of FIG. 2.

FIG. 3 is a block diagram illustrating a connection between the page buffer, column decoder, and data input/output circuit of FIG. 2.

Referring to FIG. 3, a page buffer 310, a column decoder 320, and a data input/output circuit are illustrated. Referring to FIG. 3, the data input/output circuit includes a data output unit 325 and a data input unit 330. The column decoder 320 may switch the connection of input/output lines between the page buffer 310 and the data input/output circuit.

The column decoder 320 may include transistors 311, 312, 321, and 322. The transistors 311, 312, 321, and 322 control the connections between bit lines BITOUT and BITOUTB, the page buffer 310, data output unit 325, and the data input unit 330 based on control signals YDATA<0> and YDATA_DIN.

During a data output period, output data is outputted from the page buffer 310. During this period, the control signal YDATA<0> has a high level value, and the transistors 311 and 312 are turned on. Therefore, the output data, outputted from the page buffer 310, is delivered to the bit lines BITOUT and BITOUTB. Meanwhile, during the data output period, the control signal YDATA_IN has a high-level value, and the transistors 321 and 322 are turned on. Therefore, the data delivered to the bit lines BITOUT and BITOUTB is delivered to internal I/O lines IO2 and IO2B. The output data, delivered to the internal I/O lines IO2 and IO2B, is inputted to the data output unit 325, and is then delivered to an I/O line IO1 through the data output unit 325.

During a data input period, input data is delivered to the I/O line IO1. The input data is inputted to the data input unit 330. The data input unit 330 delivers the received input data to the internal I/O lines IO2 and IO2B. During the data input period, the control signal YDATA_IN has a high level value, and the transistors 321 and 322 are turned on. Therefore, the input data delivered to the internal I/O lines IO2 and IO2B is delivered to the bit lines BITOUT and BITOUTB. During the data input period, the control signal YDATA<0> has a high level value, and the transistors 311 and 312 are turned on. The input data, delivered to the bit lines BITOUT and BITOUTB, is delivered to the page buffer 310.

As described above, the data input/output circuit according to an embodiment of the present disclosure includes the data output unit 325 and the data input unit 330. Further, a signal reception unit in the data input unit 330 according to an embodiment of the present disclosure outputs a constant voltage value regardless of output data on the I/O line IO1 during the data output period of the semiconductor memory device. Therefore, the amount of current flowing through the data input unit 330 is decreased, and thus power consumption may be reduced. Below, a description will be made based on the operation of the data input unit 330 in the data input/output circuit with reference to FIGS. 4 to 12.

FIG. 4 is a block diagram illustrating an example of the data input unit of FIG. 3.

Referring to FIG. 4, the data input unit of a data input/output circuit according to an embodiment of the present disclosure may include a signal reception unit 340 and a data delivery unit 345. The signal reception unit 340 is connected to an I/O line. During a data input period, the signal reception unit 340 receives data Data from the I/O line and delivers the data to the data delivery unit 345, and the data delivery unit outputs the data to internal I/O lines IO2 and IO2B. As described above with reference to FIG. 3, the data outputted to the internal I/O lines IO2 and IO2B is delivered to a page buffer. In this case, data appearing on the I/O lines is input data.

That is, during the data input period, the data input unit including the signal reception unit 340 and the data delivery unit 345 delivers the data Data, inputted from the I/O line IO1, to the page buffer.

In an embodiment illustrated in FIG. 4, the signal reception unit 340 receives a data input enable signal DIEN. The data input enable signal DIEN, which is required to control the operation of the data input unit, may be enabled during the data input period. That is, the data input enable signal DIEN may have a high-level voltage value during the data input period. The signal reception unit 340 may perform a logical operation on the data Data and the data input enable signal DIEN, which are inputted from the I/O line, and deliver the result of the logical operation to the data delivery unit 345 through the output terminal of the signal reception unit 340, that is, a first internal node GIO. In an embodiment, during the data input period, the data input enable signal DIEN has a high-level voltage value, and the signal reception unit 340 may output the data Data, inputted from the I/O line, to the first internal node GIO in response to the data input enable signal DIEN having a high-level voltage value. In this case, the data delivery unit 345 may latch the data Data, outputted to the first internal node GIO, and deliver the latched data to the internal I/O lines IO2 and IO2B. According to an embodiment, the data delivery unit 345 may deliver the input data by pulling-up and pulling down the internal I/O lines IO2 and IO2B. Further, the logic levels of the signals may be different from or the opposite of those described. For example, a signal described as having a logic "high" level may alternatively have a logic "low" level, and a signal described as having a logic "low" level may alternatively have a logic "high" level.

During the data output period, the data input enable signal DIEN may have a low-level voltage value. In this case, unlike the data input period, the signal reception unit 340 may output a constant voltage value to the first internal node GIO regardless of data Data on the I/O line based on the data input enable signal DIEN having the low-level voltage value. During the data output period, as described above with reference to FIGS. 2 and 3, the data, outputted through the page buffer, is outputted to the data I/O line IO1 through the data output unit 325. Therefore, during the data output period, the data Data, outputted to the outside of the data in/output device through the I/O line IO1, may be input to the signal reception unit 340 of the data input unit 330. The signal reception unit 340, included in the data input unit of the data input/output device according to an embodiment of the present disclosure, may output a constant voltage value to the first internal node GIO regardless of the output data appearing on the I/O line when the data input enable signal DIEN maintains a low-level voltage value. For example, during the data output period, the signal reception unit 340 may output the low-level voltage value to the first internal node GIO. In this case, since the voltage value, inputted to the data delivery unit 345, is fixed, unnecessary current consumption in the data delivery unit 345 is decreased, thus consequently reducing power consumption in the data input unit 330 and the data input/output circuit 260 including the data input unit during the data output period.

FIG. 5 is a block diagram illustrating an example of the data delivery unit of FIG. 4.

Referring to FIG. 5, the data delivery unit may include a first circuit unit 351, a data latch unit 352, a second circuit unit 353, a third circuit unit 354, a fourth circuit unit 355, a fifth circuit unit 356, a sixth circuit unit 357, a seventh circuit unit 358, a first initialization transistor 359, and a second initialization transistor 360.

The first circuit unit 351 may be coupled to the output terminal of the signal reception unit 340 of FIG. 4, that is, a first internal node GIO. During the data input period, the first circuit unit 351 may receive data Data from the signal reception unit 340 and deliver inverted data of the received data to a second internal node GIOB. In an embodiment, the first circuit unit 351 may function as an inverter for inverting a logical value on the first internal node GIO, and outputting the inverted logical value to a second internal node GIOB. In an embodiment, the first circuit unit 351 may be an inverter operating based on a clock signal. Therefore, during the data input period, the first circuit unit 351 may output inverted data obtained by logically inverting the data, outputted from the signal reception unit 340, to the second internal node GIOB.

During the data output period, the signal reception unit 340 outputs a constant voltage value to the first internal node GIO. Therefore, the first circuit unit 351 may output a constant voltage value, obtained by logically inverting a voltage on the first internal node GIO, to the second internal node GIOB during the data output period. Therefore, during the data output period, the input/output terminals of the first circuit unit 351 and the internal voltage do not change, thus reducing unnecessary power consumption.

The data latch unit 352 may latch a voltage value on the second internal node GIOB. Further, the data latch unit 352 may also latch an inverted voltage value on the second internal node GIOB. During the data input period, the data latch unit 352 may latch the inverted data, outputted from the first circuit unit 351, and may also latch original data that is inverted data of the inverted data. The original data may be delivered to the third circuit unit 354 through a third internal node GIOD, and inverted data may be delivered to the second circuit unit 353. The internal configuration and input/output relation of the data latch unit 352 will be described later with reference to FIG. 6. During the data output period, the data latch unit 352 may maintain a constant voltage state.

The second circuit unit 353 may receive the inverted data from the data latch unit 352 during the data input period, invert the inverted data, and then output original data. That is, the input terminal of the second circuit unit 353 is coupled to the second internal node GIOB, and a voltage value appearing on the second internal node GIOB during the data input period is a voltage value indicating inverted data obtained by logically inverting the original data. Meanwhile, the output terminal of the second circuit unit 353 is coupled to a fourth internal node PD2, and a voltage value appearing on the fourth internal node PD2 during the data input period is a voltage value indicating original data inputted from the I/O line IO1. During the data output period, the input/output terminals of the second circuit unit 353 may be maintained in a constant voltage state.

The third circuit unit 354 may receive original data Data from the data latch unit 352, invert the original data, and output inverted data during the data input period. That is, the input terminal of the third circuit unit 354 is coupled to the third internal node GIOD, and a voltage value appearing on the third internal node GIOD during the data input period is a voltage value indicating the original data Data. Meanwhile, the output terminal of the third circuit unit 354 is coupled to a fifth internal node PD1, and a voltage value appearing on the fifth internal node PD1 during the data input period is a voltage value indicating logically inverted data of the original data Data that is inputted from the I/O line IO1. During the data output period, the input/output terminals of the third circuit unit 354 may be maintained in a constant voltage state.

In an embodiment, the second circuit unit 353 may function as an inverter for inverting a logical value on the second internal node GIOB, and outputting the inverted logical value to the fourth internal node PD2. In an embodiment, the second circuit unit 353 may be an inverter operating based on a clock signal. Therefore, during the data input period, the second circuit unit 353 may output the original data Data, which is obtained by logically inverting the inverted data outputted from the data latch unit 352, to the fourth internal node PD2. Meanwhile, the third circuit unit 354 may function as an inverter for inverting a logical value on the third internal node GIOD and outputting the inverted logical value to the fifth internal node PD1. In an embodiment, the third circuit unit 354 may be an inverter operating based on a clock signal. Therefore, during the data input period, the third circuit unit 354 may output inverted data, obtained by logically inverting the data Data outputted from the data latch unit 352, to the fifth internal node PD1.

The first and second initialization transistors 359 and 360 may initialize the fourth and fifth internal nodes PD2 and PD1, respectively. That is, the first and second initialization transistors 359 and 360 are turned on in response to an initialization signal LIOPCG that is enabled in an initialization operation, thus enabling the fourth and fifth internal nodes PD2 and PD1 to be grounded. The initialization operation may be performed either after a data input operation in the data input period has been completed, or before a data input operation in the data input period is started. According to an embodiment, the initialization operation may be performed either after a data output operation in the data output period has been completed, or before a data output operation in the data output period is started.

The fourth circuit unit 355 may receive data Data from the second circuit unit 353, generate first inverted data and first non-inverted data, and output the first inverted data and the first non-inverted data to a sixth internal node PD2B and a seventh internal node PD2D, respectively, during the data input period. That is, during the data input period, the fourth circuit unit 355 may generate the first inverted data and the first non-inverted data based on the data Data, inputted through the fourth internal node PD2. The first inverted data is logically inverted data of the original data Data inputted through the I/O line IO1. The first non-inverted data is the original data Data, inputted through the I/O line IO1. The first inverted data is outputted through the sixth internal node PD2B, and the first non-inverted data is outputted through the seventh internal node PD2D. The first inverted data and the first non-inverted data are inputted to the sixth circuit unit 357.

The fifth circuit unit 356 may receive the inverted data from the third circuit unit 354, generate second inverted data and second non-inverted data, and output the second inverted data and the second non-inverted data to the ninth and eighth internal nodes PD1D and PD1B, respectively, during the data input period. That is, during the data input period, the fifth circuit unit 356 may generate the second inverted data and the second non-inverted data based on the inverted data inputted through the fifth internal node PD1. The second inverted data is logically inverted data of the original data Data inputted through the I/O line IO1. The second non-inverted data is the original data Data inputted through the I/O line IO1. The second inverted data is outputted through the ninth internal node PD1D, and the second non-inverted data is outputted through the eighth internal node PD1B. The second inverted data and the second non-inverted data are inputted to the seventh circuit unit 358.

The sixth circuit unit 357 receives the first inverted data, the first non-inverted data, and the data input enable signal DIEN, and then pulls up and down the internal I/O line IO2. For example, the sixth circuit unit 357 may pull up the internal I/O line IO2 based on the data input enable signal DIEN at a high level and the first non-inverted data at a high level. Further, the sixth circuit unit 357 may pull down the internal I/O line IO2 based on the data input enable signal DIEN at a high level and the first inverted data at a high level. The sixth circuit unit 357 may float the internal I/O line IO2 based on the data input enable signal DIEN at a low level.

The seventh circuit unit 358 receives the second inverted data, the second non-inverted data, and the data input enable signal DIEN, and then pulls up and down the internal I/O line IO2B. For example, the seventh circuit unit 358 may pull up the internal I/O line IO2B based on the data input enable signal DIEN at a high level and the second inverted data at a high level. Further, the seventh circuit unit 358 may pull down the internal I/O line IO2B based on the data input enable signal DIEN at a high level and the second non-inverted data at a high level. The seventh circuit unit 358 may float the internal I/O line IO2B based on the data input enable signal DIEN at a low level.

Configurations of the sixth circuit unit 357 and the seventh circuit unit 358 will be described later with reference to FIGS. 8 and 9.

Figure 6:
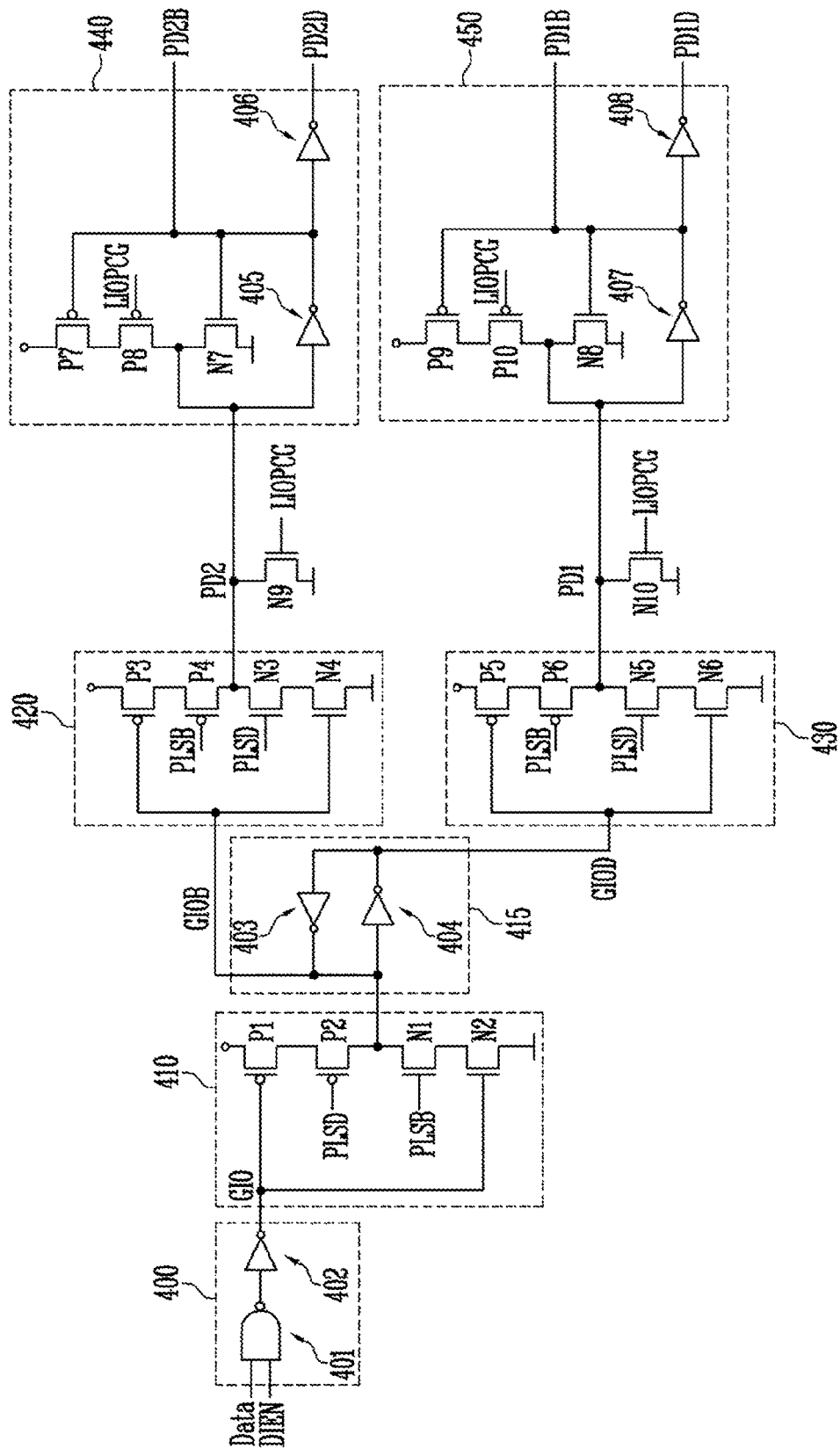
FIG. 6 is a circuit diagram illustrating part of the data input unit of FIG. 3.

FIG. 6 is a circuit diagram illustrating an example of a part of the data input unit of FIG. 3.

Referring to FIG. 6, the data input unit 330 of FIG. 3 may include a signal reception unit 400 and a data delivery unit. Referring to FIG. 6, configuration of only part of the data delivery unit illustrated in a block diagram in FIG. 5 is illustrated. That is, FIG. 6 illustrates the signal reception unit 340 illustrated in FIG. 4, and the first circuit unit 351, the data latch unit 352, the second circuit unit 353, the third circuit unit 354, the fourth circuit unit 355, the fifth circuit unit 356, the first initialization transistor 359, and the second initialization transistor 360 which are illustrated in FIG. 5. The data delivery unit according to an embodiment of the present disclosure may latch data inputted to the signal reception unit 400 during a data input period, and deliver the latched data to the page buffer 310. Also, the data delivery unit according to an embodiment of the present disclosure may include a first circuit unit 410, a data latch unit 415, a second circuit unit 420, a third circuit unit 430, a fourth circuit unit 440, and a fifth circuit unit 450. As illustrated in FIG. 5, the data delivery unit according to an embodiment of the present disclosure may further include a sixth circuit unit illustrated in FIG. 8 and a seventh circuit unit illustrated in FIG. 9. The sixth circuit unit illustrated in FIG. 8 may be coupled to the fourth circuit unit 440 of FIG. 6. The seventh circuit unit illustrated in FIG. 9 may be coupled to the fifth circuit unit 450 of FIG. 6. The data delivery unit may further include n-type transistors N9 and N10. That is, the data delivery unit according to an embodiment of the present disclosure may be configured to include first to fifth circuit units 410, 420, 430, 440, and 450, the data latch unit 415, and the n-type transistors N9 and N10, which are illustrated in FIG. 6, the sixth circuit unit, which is illustrated in FIG. 8, and the seventh circuit unit, which is illustrated in FIG. 9. The n-type transistor N9 of FIG. 6 may be the first initialization transistor 359 of FIG. 5, and the n-type transistor N10 of FIG. 6 may be the second initialization transistor 360 of FIG. 5. The configuration and operation of the sixth circuit unit and seventh circuit unit will be described later with reference to FIGS. 8 and 9.

The first circuit unit 410 includes p-type transistors P1 and P2 and n-type transistors N1 and N2. The data latch unit includes inverters 403 and 404. The second circuit unit 420 includes p-type transistors P3 and P4 and n-type transistors N3 and N4. The third circuit unit 430 includes p-type transistors P5 and P6 and n-type transistors N5 and N6. The fourth circuit unit 440 includes p-type transistors P7 and P8, the n-type transistor N7, and the inverters 405 and 406. The fifth circuit unit 450 includes p-type transistors P9 and P10, an n-type transistor N8, and inverters 407 and 408. The n-type transistors N9 and N10 may be configured to initialize voltages on the fourth and fifth internal nodes PD2 and PD1.

The signal reception unit 400 is coupled to the I/O line IO1 and receives the data input enable signal DIEN. For example, the signal reception unit 400 receives data Data from the I/O line IO1 and receives the data input enable signal DIEN from the control logic 240. In accordance with the data input/output circuit and the data input unit included therein according to an embodiment of the present disclosure, the signal reception unit 400 maintains at least one node included in the data delivery unit at a low level regardless of a change in the voltage of the I/O line IO1, based on the data input enable signal DIEN which is maintained at a low level during a data output period. Since the voltage level of the at least one is maintained at a low level, the amount of current flowing through the data delivery unit is decreased, and thus power consumption may be reduced. Maintaining the voltage level of the at least one node in the data delivery unit at the low level is for example only. In accordance with the data input/output circuit and the data input unit included therein according to other embodiments of the present disclosure, the signal reception unit 400 may maintain at least one node in the data delivery unit at a high level regardless of the change in the voltage of the I/O line IO1, based on the data input enable signal DIEN which is maintained at a low level during the data output period. Since the voltage level on the at least one node is maintained at a high level, the amount of current flowing through the data delivery unit is decreased, and thus power consumption may be reduced.

The signal reception unit 400 outputs a data signal Data appearing on the I/O line IO1 during the data input period, and may output a low-level signal regardless of the potential level appearing on the I/O line IO1 during the data output period. In other embodiments, the signal reception unit 400 may output the data signal Data appearing on the I/O line IO1 during the data input period, and may output a high-level signal regardless of the potential level appearing on the I/O line IO1 during the data output period.

For example, as illustrated in FIG. 6, the signal reception unit 400 may include a NAND gate 401 for receiving the data Data on the I/O line IO1 and the data input enable signal DIEN as input, and an inverter 402 connected thereto. Therefore, the signal reception unit 400 may output the result of a NAND operation on the data on the I/O line IO1 and the data input enable signal DIEN. Referring to FIG. 6, although the signal reception unit 400 is illustrated as including the NAND gate 401 and the inverter 402, the signal reception unit 400 may include a single AND gate according to an embodiment.

Hereinafter, the operations of the data input unit during a data input period and a data output period will be described.

During the data input period, the data input enable signal DIEN inputted to the signal reception unit 400 may be maintained at a high level. During the data input period, a voltage on the I/O line IO1 is the input data delivered from the outside, for example, the controller 110 of FIG. 1. The signal reception unit 400 may output the result of performing an AND operation on the data signal Data and the data input enable signal DIEN. Therefore, in this case, the data signal Data appearing on the I/O line IO1 is input data, which may be delivered to the output terminal of the signal reception unit 400.

Each of the first circuit unit 410, the second circuit unit 420, and the third circuit unit 430 of FIG. 6 may act as an inverter based on the second clock signal PLSB and the third clock signal PLSD. Therefore, the data signal Data appears on the first internal node GIO, an inverted signal of the data signal Data appears on the second internal node GIOB, and the inverted data signal is latched in the data latch unit 415. Since the second circuit unit 420 receives the inverted data signal, it may output the original signal to the fourth internal node PD2. Further, since the third circuit unit 430 receives the original data signal, it may output the inverted data signal to the fifth internal node PD1.

That is, the first circuit unit 410 may be coupled to the first internal node GIO. During the data input period, the first circuit unit 410 may receive the data Data from the signal reception unit 400, and deliver inverted data of the data Data to the second internal node GIOB. In an embodiment, the first circuit unit 410 may function as an inverter for inverting a logical value on the first internal node GIO, and outputting the inverted logical value to the second internal node GIOB. The first circuit unit 410 may be an inverter operating based on the third clock signal PLSD and the second clock signal PLSB. Therefore, during the data input period, the first circuit unit 410 may output inverted data, obtained by logically inverting the data, outputted from the signal reception unit 400, to the second internal node GIOB.

During the data output period, the signal reception unit 400 outputs a constant voltage value to the first internal node GIO. Therefore, the first circuit unit 410 may output a constant voltage, obtained by logically inverting a voltage appearing on the first internal node GIO during the data output period, to the second internal node GIOB. As a result, during the data output period, the input/output terminals and the internal voltage of the first circuit unit 410 are not changed, and thus unnecessary power consumption may be reduced.

The data latch unit 415 may latch a voltage value on the second internal node GIOB. Further, the data latch unit 415 may also latch an inverted voltage value on the second internal node GIOB. During the data input period, the data latch unit 415 may latch the inverted data, outputted from the first circuit unit 410, and may also latch original data that is inverted data of the inverted data. The original data may be delivered to the third circuit unit 430 through the third internal node GIOD, and inverted data may be delivered to the second circuit unit 420. During the data output period, the data latch unit 415 may maintain a constant voltage state.

The second circuit unit 420 may receive the inverted data from the data latch unit 415 during the data input period, invert the inverted data, and then output original data. That is, the input terminal of the second circuit unit 420 is coupled to the second internal node GIOB, and a voltage value appearing on the second internal node GIOB during the data input period is a voltage value indicating inverted data obtained by logically inverting the original data. Meanwhile, the output terminal of the second circuit unit 420 is coupled to a fourth internal node PD2, and a voltage value appearing on the fourth internal node PD2 during the data input period is a voltage value indicating original data inputted from the I/O line IO1. During the data output period, the input/output terminals of the second circuit unit 420 may be maintained in a constant voltage state.

The third circuit unit 430 may receive original data Data from the data latch unit 415, invert the original data, and output inverted data during the data input period. That is, the input terminal of the third circuit unit 430 is coupled to the third internal node GIOD, and a voltage value appearing on the third internal node GIOD during the data input period is a voltage value indicating the original data Data. Meanwhile, the output terminal of the third circuit unit 430 is coupled to a fifth internal node PD1, and a voltage value appearing on the fifth internal node PD1 during the data input period is a voltage value indicating logically inverted data of the original data Data that is inputted from the I/O line IO1. During the data output period, the input/output terminals of the third circuit unit 430 may be maintained in a constant voltage state.

In an embodiment, the second circuit unit 420 may function as an inverter for inverting a logical value on the second internal node GIOB and outputting the inverted logical value to the fourth internal node PD2. In the embodiment of FIG. 6, the second circuit unit 420 may be an inverter operating based on the third and second clock signals PLSD and PLSB. Therefore, during the data input period, the second circuit unit 420 may output the original data Data, which is obtained by logically inverting the inverted data outputted from the data latch unit 415, to the fourth internal node PD2. Meanwhile, the third circuit unit 430 may function as an inverter for inverting a logical value on the third internal node GIOD and outputting the inverted logical value to the fifth internal node PD1. In an embodiment of FIG. 6, the third circuit unit 430 may be an inverter operating based on the third and second clock signals PLSD and PLSB. Therefore, during the data input period, the third circuit unit 430 may output inverted data, obtained by logically inverting the data Data outputted from the data latch unit 415, to the fifth internal node PD1.

The first and second initialization transistors N9 and N10 may initialize the fourth and fifth internal nodes PD2 and PD1, respectively. That is, the first and second initialization transistors N9 and N10 are turned on in response to an initialization signal LIOPCG that is enabled in an initialization operation, thus enabling the fourth and fifth internal nodes PD2 and PD1 to be grounded. The initialization operation may be performed either after a data input operation in the data input period has been completed, or before a data input operation in the data input period is started. According to an embodiment, the initialization operation may be performed either after a data output operation in the data output period has been completed, or before a data output operation in the data output period is started.

Referring to the fourth circuit unit 440, on the sixth internal node PD2B, an inverted voltage of the voltage on the fourth internal node PD2 appears. Since the data signal Data appears on the fourth internal node PD2, the inverted data signal is outputted to the sixth internal node PD2B. Further, the data signal Data is outputted to the seventh internal node PD2D.

That is, as described above with reference to FIGS. 5 & 6, the fourth circuit unit 440 may receive data Data from the second circuit unit 420, generate first inverted data and first non-inverted data, and output the first inverted data and the first non-inverted data to a sixth internal node PD2B and a seventh internal node PD2D, respectively, during the data input period. That is, during the data input period, the fourth circuit unit 440 may generate the first inverted data and the first non-inverted data based on the data Data, inputted through the fourth internal node PD2. The first inverted data is logically inverted data of the original data Data inputted through the I/O line IO1. The first non-inverted data is the original data Data, inputted through the I/O line IO1. The first inverted data is outputted through the sixth internal node PD2B, and the first non-inverted data is outputted through the seventh internal node PD2D. The first inverted data and the first non-inverted data are inputted to the sixth circuit unit.

Referring to the fifth circuit unit 450, on the eighth internal node PD1B, an inverted voltage of the voltage on the fifth internal node PD1 appears. Since the inverted data signal appears on the fifth internal node PD1, the data signal Data is outputted to the eighth internal node PD1B. Further, an inverted data signal is outputted to the ninth internal node PD1D. The n-type transistors N9 and N10 may receive the initialization signal LIOPCG through the gate electrodes thereof, and may initialize the fourth internal node PD2 and the fifth internal node PD1 to a ground voltage.

That is, as described above with reference to FIGS. 5 & 6, the fifth circuit unit 450 may receive inverted data from the circuit unit 430, generate second inverted data and second non-inverted data, and output the second inverted data and the second non-inverted data to the ninth and eighth internal nodes PD1D and PD1B, respectively, during the data input period. That is, during the data input period, the fifth circuit unit 450 may generate the second inverted data and the second non-inverted data based on the inverted data inputted through the fifth internal node PD1. The second inverted data is logically inverted data of the original data Data inputted through the I/O line IO1. The second non-inverted data is the original data Data inputted through the I/O line IO1. The second inverted data is outputted through the ninth internal node PD1D, and the second non-inverted data is outputted through the eighth internal node PD1B. The second inverted data and the second non-inverted data are inputted to the seventh circuit unit.

During the data output period, the data input enable signal DIEN, inputted to the signal reception unit 400, may be maintained at a low level. The voltage appearing on the I/O line IO1 during data output period is output data delivered from the page buffer. The signal reception unit 400 may output the result of an AND operation on the data signal Data and the data input enable signal DIEN. Therefore, in this case, regardless of the data signal Data appearing on the I/O line IO1, the signal reception unit 400 may output a low-level voltage. Since the first internal node GIO is maintained at a low level, the second internal node GIOB is maintained at a high level, and the third internal node GIOD may be maintained at a low level. Meanwhile, the fourth internal node PD2 may be maintained at a low level, and the fifth internal node PD1 may be maintained at a high level. Further, the sixth internal node PD2B may be maintained at a high level, and the eighth internal node PD1B may be maintained at a low level. In this way, during the data output period, the first internal node GIO, the third internal node GIOD, the fourth internal node PD2, and the eighth internal node PD1B are maintained at a low level, and the second internal node GIOB, the fifth internal node PD1, and the sixth internal node PD2B may be maintained at a high level. Therefore, during the data output period, unnecessary current consumption in the data input unit may be decreased, and consequently power consumption may be reduced.

Figure 7:
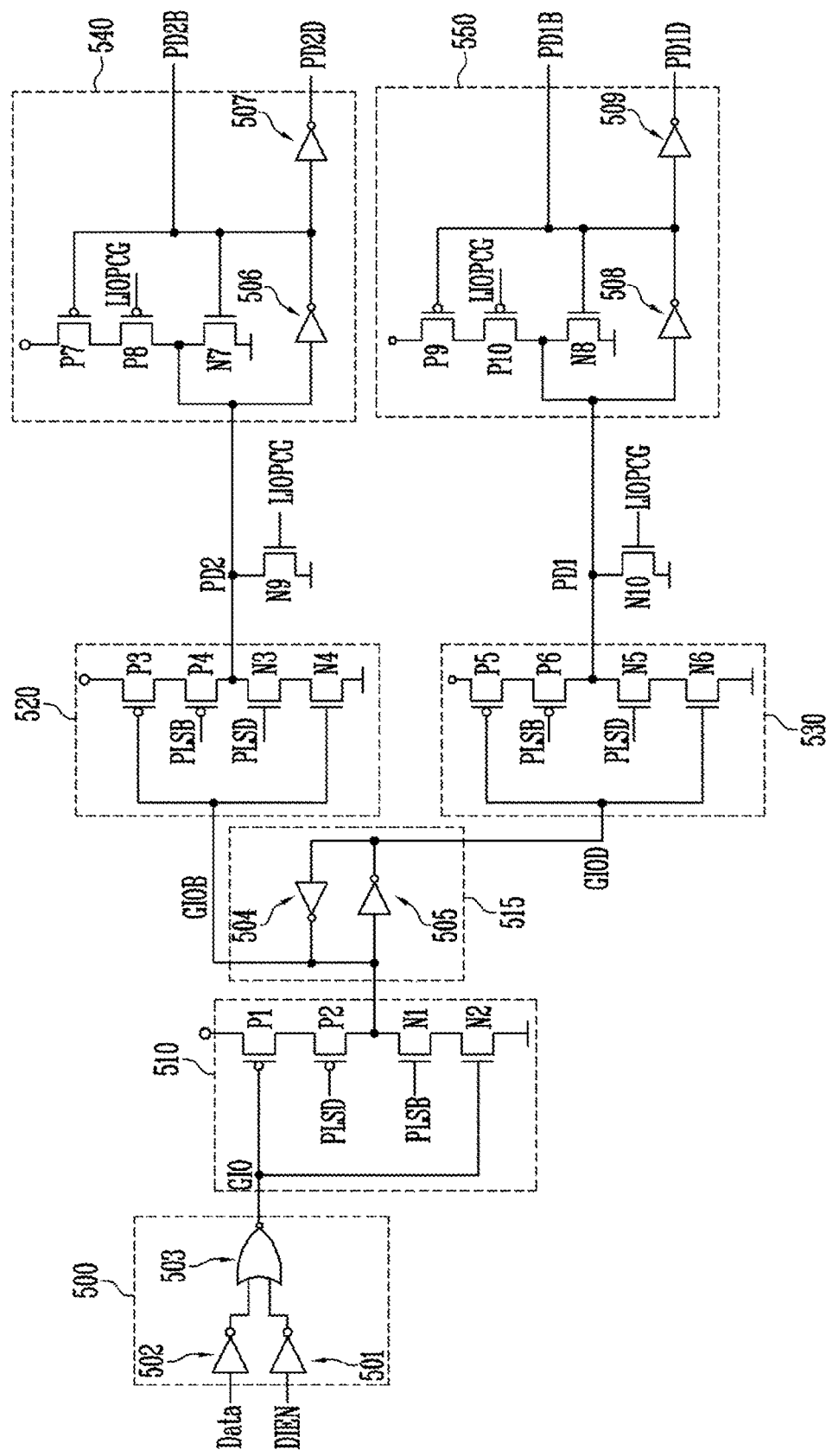
FIG. 7 is another circuit diagram illustrating part of the data input unit of FIG. 3.

FIG. 7 is another circuit diagram illustrating part of the data input unit of FIG. 3.

Referring to FIG. 7, the data input unit 330 of FIG. 3 may include a signal reception unit 500 and a data delivery unit. Similar to FIG. 6, only part of the data delivery unit is illustrated. That is, the data delivery unit may latch data inputted to the signal reception unit 400 during a data input period, and may deliver the latched data to the page buffer 310. Further, the data delivery unit according to an embodiment of the present disclosure may include a first circuit unit 510, a data latch unit 515, a second circuit unit 520, a third circuit unit 530, a fourth circuit unit 540, and a fifth circuit unit 550. The data delivery unit according to an embodiment of the present disclosure may further include a sixth circuit unit illustrated in FIG. 8 and a seventh circuit unit illustrated in FIG. 9. The sixth circuit unit illustrated in FIG. 8 may be coupled to the fourth circuit unit 540 of FIG. 7 and the seventh circuit unit illustrated in FIG. 9 may be coupled to the fifth circuit unit 550 of FIG. 7. The data delivery unit may further include n-type transistors N9 and N10. That is, the data delivery unit according to an embodiment of the present disclosure may be configured to include the first to fifth circuit units 510, 520, 530, 540, and 550, the data latch unit 515, and the n-type transistors N9 and N10, which are illustrated in FIG. 7, the sixth circuit unit, which is illustrated in FIG. 8, and the seventh circuit unit, which is illustrated in FIG. 9. As illustrated in FIG. 7, the overall configuration except for the signal reception unit 500 is identical to that of FIG. 6. The signal reception unit 500 may include inverters 501 and 502 and a NOR gate 503. That is, the signal reception unit 500 may output the result of an AND operation on the data signal Data and the data input enable signal DIEN. Therefore, the signal reception unit 500 illustrated in FIG. 7 may perform the same operation as the signal reception unit 400 illustrated in FIG. 6. That is, each of the signal reception unit 500 illustrated in FIG. 7 and the signal reception unit 400 illustrated in FIG. 6 may act as an AND gate.

Figure 8:
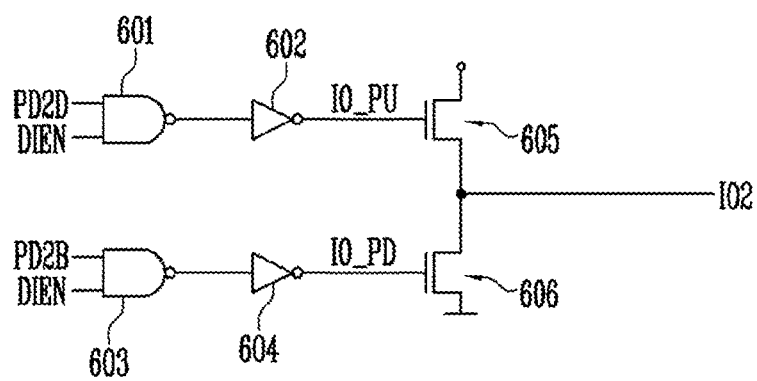
FIG. 8 is a circuit diagram illustrating a sixth circuit unit included in the data input circuit of FIG. 3.

FIG. 8 is a circuit diagram illustrating the sixth circuit unit included in the data input circuit of FIG. 3.

Referring to FIG. 8, the sixth circuit unit may include NAND gates 601 and 603, inverters 602 and 604, and n-type transistors 605 and 606. The NAND gate 601 receives a signal on the seventh internal node PD2D of FIG. 6 and a data input enable signal DIEN. The NAND gate 603 receives a signal on the sixth internal node PD2B of FIG. 6 and the data input enable signal DIEN. The result of an AND operation on the signal on the seventh internal node PD2D of FIG. 6 and the data input enable signal DIEN is outputted to a node IO_PU, and the result of an AND operation on the signal on the sixth internal node PD2B of FIG. 6 and the data input enable signal DIEN is outputted to a node IO_PD. Therefore, during the data input period, the data signal Data that is inputted to the signal reception unit 400 of FIG. 6 is outputted to the internal I/O line IO2. During the data output period, the low-level data input enable signal DIEN is input, and thus a low-level voltage is outputted to the nodes IO_PU and IO_PD, and the n-type transistors 605 and 606 are turned off.

That is, as described above with reference to FIG. 5, the sixth circuit unit receives the first inverted data and first non-inverted data, which are inputted from the fourth circuit unit 440 of FIG. 6, and the data input enable signal DIEN, and pulls up and pulls down the internal I/O line IO2. For example, the sixth circuit unit may pull up the internal I/O line IO2 based on the data input enable signal DIEN at a high level and the first non-inverted data at a high level. Further, the sixth circuit unit may pull down the internal I/O line IO2 based on the data input enable signal DIEN at a high level and the first inverted data at a high level.

The sixth circuit unit may float the internal I/O line IO2 based on the data input enable signal DIEN at a low level. Therefore, the internal I/O line IO2 floats. Since the internal I/O line IO2 is also coupled to the data output unit 325, the data delivery unit 345 of the data input unit 330 floats the internal I/O line IO2, thus enabling the output data, outputted from the page buffer 310, to be smoothly delivered to the data output unit 325.

Figure 9:
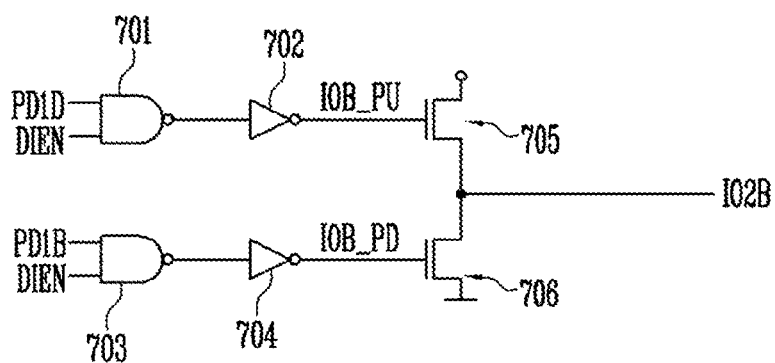
FIG. 9 is a circuit diagram illustrating a seventh circuit unit included in the data input circuit of FIG. 3.

FIG. 9 is a circuit diagram illustrating the seventh circuit unit included in the data input circuit of FIG. 3.

Referring to FIG. 9, the seventh circuit unit includes NAND gates 701 and 703, inverters 702 and 704, and n-type transistors 705 and 706. The NAND gate 701 receives a signal on the ninth internal node PD1D of FIG. 6 and a data input enable signal DIEN. The NAND gate 703 receives a signal on the eighth internal node PD1B of FIG. 6 and the data input enable signal DIEN. The result of an AND operation on the signal on the ninth internal node PD1D and the data input enable signal DIEN is outputted to a node IOB_PU, and the result of an AND gate on the signal on the eighth internal node PD1B of FIG. 6 and the data input enable signal DIEN is outputted to a node IOB_PD. Therefore, during the data input period, the data signal that is inputted to the signal reception unit 400 of FIG. 6 is inverted and output to the internal I/O line IO2B. During the data output period, a low-level data input enable signal DIEN is inputted, and thus a low-level voltage is outputted to the nodes IOB_PU and IOB_PD, and the n-type transistors 705 and 706 are turned off.

That is, as described above with reference to FIG. 5, the seventh circuit unit receives the second inverted data and the second non-inverted data, which are inputted from the fifth circuit unit 450 of FIG. 6, and the data input enable signal DIEN, and then pulls up and pulls down the internal I/O line IO2B. For example, the seventh circuit unit may pull up the internal I/O line IO2B based on the data input enable signal DIEN at a high level and the second inverted data at a high level. Further, the seventh circuit unit may pull down the internal I/O line IO2B based on the data input enable signal DIEN at a high level and the second non-inverted data at a high level.

The seventh circuit unit 358 may float the internal I/O line IO2B based on the data input enable signal DIEN at a low level. Therefore, the internal I/O line IO2B floats. Since the internal I/O line IO2B is coupled to the data output unit 325, the data delivery unit 345 of the data input unit 330 may float the internal I/O line IO2B, thus enabling the output data, outputted from the page buffer 310, to be smoothly delivered to the data output unit 325.

Figure 10:
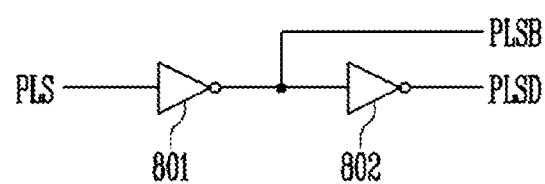
FIG. 10 is a circuit diagram illustrating a relation between the first to third clock signals.

FIG. 10 is a circuit diagram illustrating a relation between the first to third clock signals.

Referring to FIG. 10, a first clock signal PLS is inverted by an inverter 801, and then converted into a second clock signal PLSB. Further, the second clock signal PLSB is inverted by an inverter 803, and then converted into a third clock signal PSLD. The first clock signal PLS may be generated by the control logic 240 of FIG. 1 and may be inputted to the data input/output circuit 260. Also, the circuit of FIG. 10 may be located either in the control logic 240 or in the data input/output circuit 260.

Figure 11:
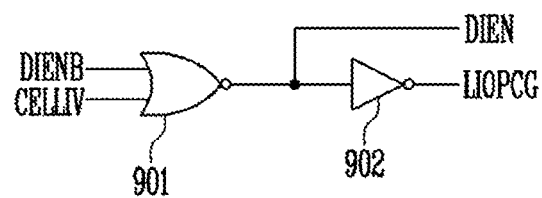
FIG. 11 is a circuit diagram illustrating a relation between a driving signal, a data enable signal, an inverted data enable signal, and initialization signals.

FIG. 11 is a circuit diagram illustrating a relation between a driving signal, a data enable signal, an inverted data enable signal, and initialization signals.

Referring to FIG. 11, an inverted data input enable signal DIENB and a driving signal CELLIV are inputted to a NOR gate 901. That is, a NOR operation on the inverted data input enable signal DIENB and the driving signal CELLIV is performed, and appears as the data input enable signal DIEN. The data input enable signal DIEN is inverted by an inverter 902, and then appears as an initialization signal LIOPCG.

Figure 12:
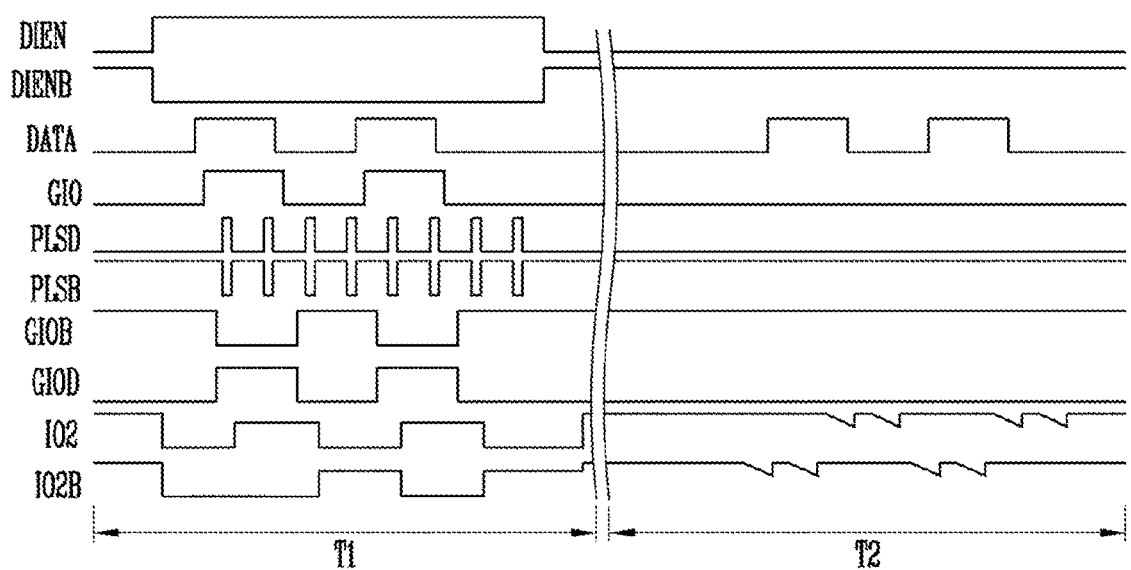
FIG. 12 is a timing diagram illustrating the operation of the data input/output circuit according to an embodiment of the present disclosure.

FIG. 12 is a timing diagram illustrating the operation of the data input/output circuit according to an embodiment of the present disclosure.

Referring to FIG. 12, voltage levels of a data input enable signal DIEN, an inverted data input enable signal DIENB, data DATA, a first internal node GIO, a third clock signal PLSD, a second clock signal PLSB, a second internal node GIOB, a third internal node GIOD, and I/O lines IO2 and IO2B are illustrated. In FIG. 12, period T1 is a data input period and period T2 is a data output period.

During the data input period T1, the data input enable signal DIEN has a high-level voltage value, and the inverted data input enable signal DIENB has a low-level voltage value. Accordingly, as illustrated in FIG. 6, data DATA is outputted to the output terminal of the signal reception unit 400, and thus the first internal node GIO has the same voltage value as the data DATA. During the data input period, the third clock signal PLSD and the second clock signal PLSB are synchronized with an internal clock signal. Further, as described above with reference to FIG. 6, an inverted signal of the data signal DATA appears on the second internal node GIOB, and the original data appears on the third internal node GIOD. Meanwhile, as described above with reference to FIGS. 8 and 9, data signal DATA appears on the I/O line IO2 and an inverted signal of the data signal DATA appears on the I/O line IO2B.

During the data output period T2, the data input enable signal DIEN has a low-level voltage value, and the, inverted data input enable signal DIENB has a high-level voltage value. Therefore, even if output data appears on the I/O line IO1, the first internal node GIO and the third internal node GIOD are maintained at a low-level voltage value, and the second internal node GIOB is maintained at a high-level voltage value. Meanwhile, during the data output period, the third clock signal PLSD and the second clock signal PLSB are not synchronized with an internal clock signal, wherein the third clock signal PLSD is maintained at a low-level voltage value, and the second clock signal PLSB is maintained at a high-level voltage value. Meanwhile, output data, outputted from the page buffer 310, may appear on the I/O lines IO2 and IO2B.

As illustrated in FIG. 12, the data input unit of the data input/output circuit according to an embodiment of the present disclosure maintains at least one node in the data delivery unit (i.e., see FIG. 4 element 345) at a low level or high level based on the data input enable signal having a low level voltage value during the data output period T2. Therefore, the amount of current flowing through the data input unit is decreased, and thus power consumption may be reduced.

Figure 13:
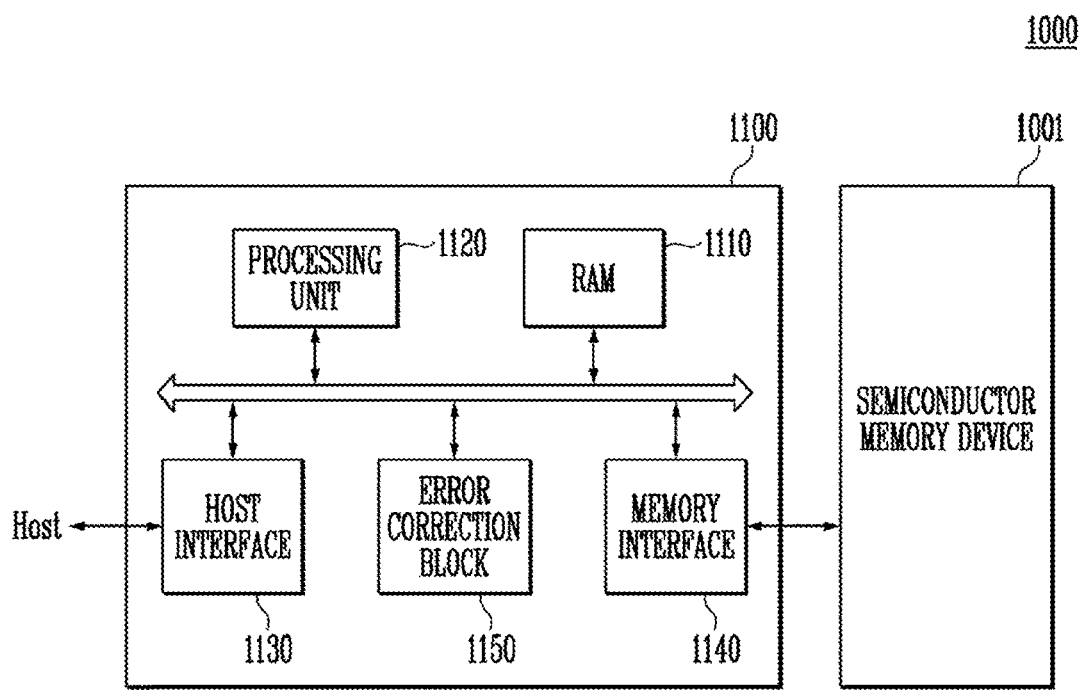
FIG. 13 is a block diagram illustrating an embodiment of a memory system including the semiconductor memory device of FIG. 2.

FIG. 13 is a block diagram for describing an embodiment of a memory system including the semiconductor memory device of FIG. 2.

Referring to FIG. 13, the memory system 1000 includes the semiconductor memory device 1001 and a controller 1100.

The semiconductor memory device 1001 may have the same or substantially the same configuration and operation as those of the semiconductor memory devices described with reference to FIG. 2. Hereinafter, repetitive explanations will be omitted.

The controller 1100 is coupled to a host Host and the semiconductor memory device 1001. The controller 1100 is configured to access the semiconductor memory device 1001 in response to a request from the host Host. For example, the controller 1100 is configured to control read, write, erase, and background operations of the semiconductor memory device 1001. The controller 1100 is configured to provide an interface between the host Host and the semiconductor memory device 1001. The controller 1100 is configured to drive firmware for controlling the semiconductor memory device 1001.

The controller 1100 includes a RAM (Random Access Memory) 1110, a processing unit 1120, a host interface 1130, a memory interface 1140, and an error correction block 1150. The RAM 1110 is used as at least one of an operation memory of the processing unit 1120, a cache memory between the semiconductor memory device 1001 and the host Host, and a buffer memory between the semiconductor memory device 1001 and the host Host. The processing unit 1120 controls the overall operation of the controller 1100. In addition, the controller 1100 may temporarily store program data provided from the host Host during the write operation.

The host interface 1130 includes a protocol for performing data exchange between the host Host and the controller 1100. In an example of an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI)

protocol, and an integrated drive electronics (IDE) protocol, a private protocol, and the like.

The memory interface 1140 interfaces with the semiconductor memory device 1001. For example, the memory interface includes a NAND interface or NOR interface.

The error correction block 1150 uses an error correcting code (ECC) to detect and correct an error in data received from the semiconductor memory device 1001. The processing unit 1120 may adjust the read voltage according to an error detection result from the error correction block 1150, and control the semiconductor memory device 1001 to perform re-reading. In an example of an embodiment, the error correction block may be provided as an element of the controller 1100.

The controller 1100 and the semiconductor memory device 1001 may be integrated into a single semiconductor device. In an example of an embodiment, the controller 1100 and the semiconductor memory device 1001 may be integrated into a single semiconductor device to form a memory card. For example, the controller 1100 and the semiconductor memory device 1001 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 1001 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an example of an embodiment, the semiconductor memory device 1001 or the memory system 1000 may be embedded in various types of packages. For example, the semiconductor memory device 1001 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 14:
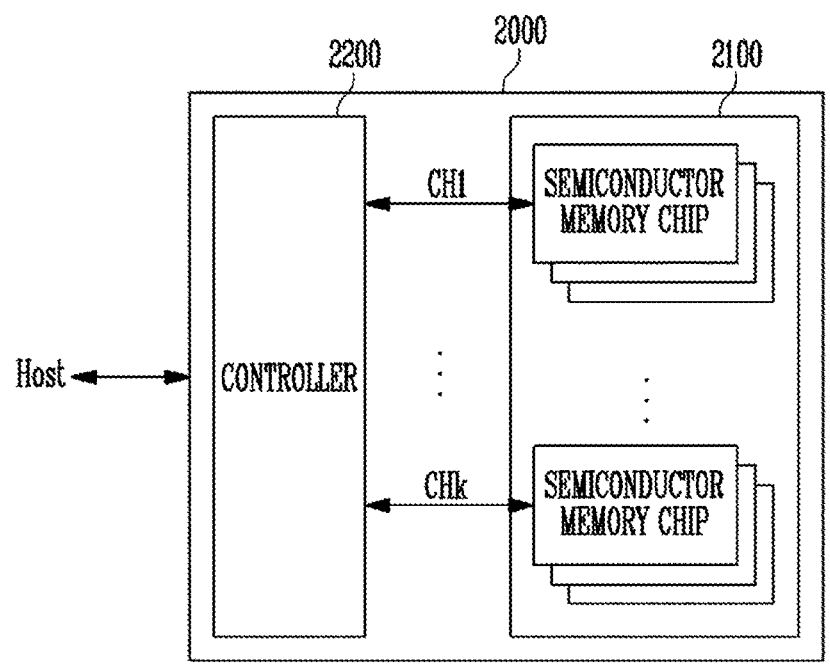
FIG. 14 is a block diagram illustrating an embodiment of the memory system of FIG. 13.

FIG. 14 is a block diagram illustrating an embodiment of the memory system of FIG. 13.

Referring FIG. 14, a memory system 2000 includes a semiconductor memory device 2100 and a controller 2200. The semiconductor memory device 2100 includes a plurality of memory chips. The semiconductor memory chips are divided into a plurality of groups.

Referring to FIG. 14, it is illustrated that each of the plurality of groups communicates with the controller 2200 through first to k-th channels CH1 to CHk. Each semiconductor memory chip may have the same or substantially the same configuration and operation as those of an embodiment of the semiconductor memory devices 1001 described with reference to FIG. 2.

Each group communicates with the controller 2200 through one common channel. The controller 2200 has the same configuration as that of the controller 1100 described with reference to FIG. 13 and is configured to control a plurality of memory chips of the semiconductor memory device 2100 through the plurality of channels CH1 to CHk.

Figure 15:
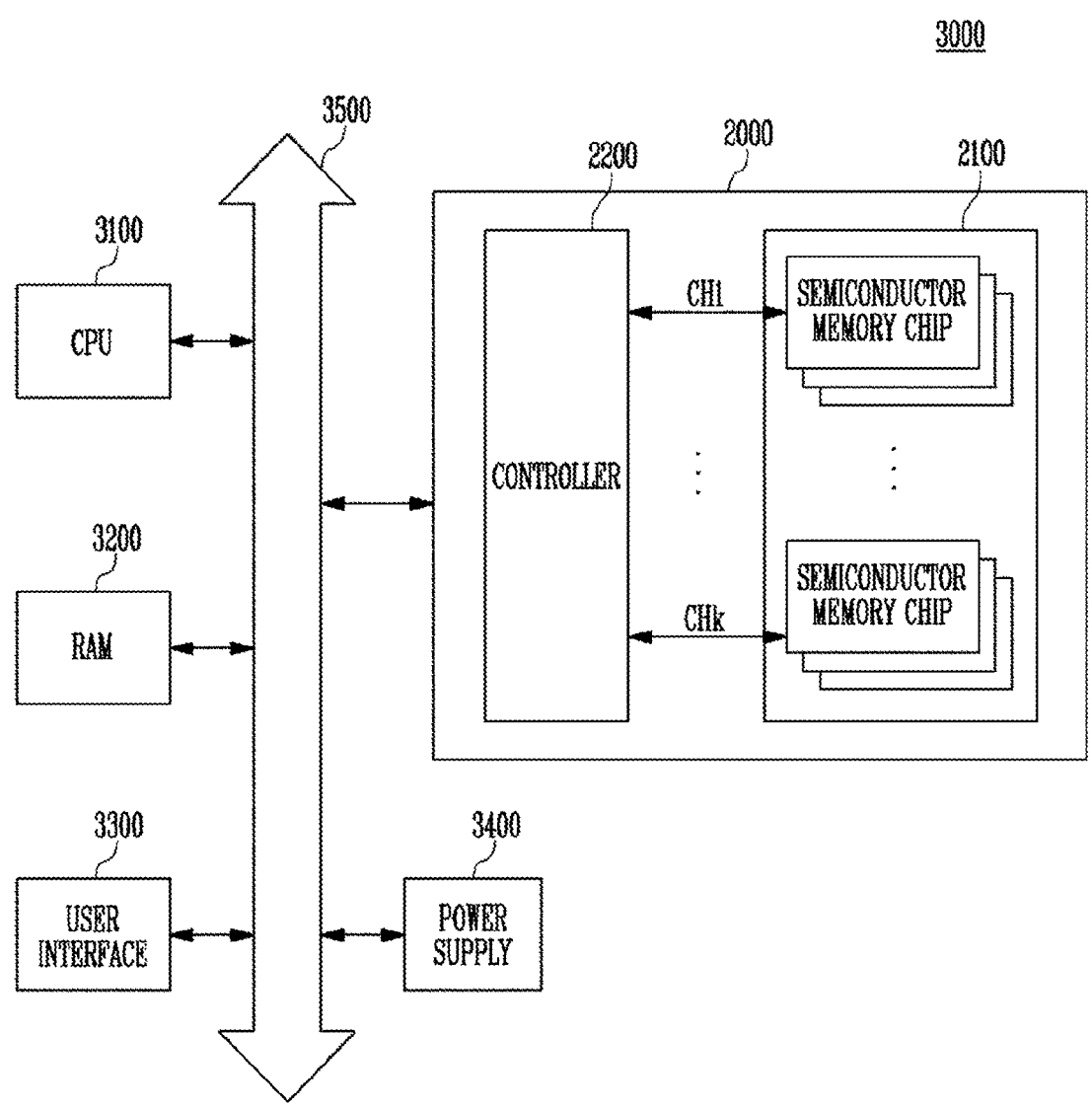
FIG. 15 is a block diagram illustrating a computing system including the memory system of FIG. 14.

FIG. 15 is a block diagram illustrating a computing system including the memory system of FIG. 14.

A computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 15, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 15, the memory system 2000 described with reference to FIG. 14 is illustrated as being used. However, the memory system 2000 may be replaced with the memory system 1000 described with reference to FIG. 13. In an example of an embodiment, the computing system 3000 may include all of the memory systems 1000 and 2000 described with reference to FIGS. 13 and 14.

According to an embodiment of the present disclosure, a data input/output circuit capable of reducing power consumption may be provided.

According to an embodiment of the present disclosure, a semiconductor memory device capable of reducing power consumption may be provided.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A data input/output (input and output) circuit coupled to an input/output line and internal input/output line for inputting/outputting (inputting and outputting) data, comprising:
a data input unit configured to deliver input data inputted through the input/output line to the internal input/output line during a data input period; and
a data output unit configured to deliver output data outputted from the internal input/output line to the input/output line during a data output period,
wherein the data input unit comprises:
a signal reception unit coupled to the input/output line and configured to receive the input data from the input/output line, based on a data input enable signal maintained at a high-level voltage value during the data input period; and
a data delivery unit configured to deliver the input data inputted to the signal reception unit to the internal input/output line during the data input period,
wherein the signal reception unit outputs a constant voltage value regardless of the output data appearing on the input/output line, based on the data input enable signal maintained at a low-level voltage value during the data output period.

2. The data input/output circuit according to claim 1, wherein the signal reception unit performs a logical operation on the data input enable signal and data appearing on the input/output line, and delivers a result of the logical operation to the data delivery unit.

3. The data input/output circuit according to claim 2,
wherein the data appearing on the input/output line data output period is the output data received from the internal input/output line,
wherein the data appearing on the input/output line during the data input period is the input data inputted from outside through the input/output line, and
wherein the signal reception unit is configured to output a low-level voltage value, regardless of the output data appearing on the input/output line, based on the data input enable signal maintained at a low level during the data output period.

4. The data input/output circuit according to claim 2,
wherein the data appearing on the input/output line during the data output period is the output data received from the internal input/output line,
wherein the data appearing on the input/output line during the data input period is the input data inputted from outside through the input/output line, and
wherein the signal reception unit is configured to output the input data appearing on the input/output line, based on the data input enable signal maintained at a high level during the data input period.

5. The data input/output circuit according to claim 1, wherein the data delivery unit comprises:
a first circuit unit coupled to an output terminal of the signal reception unit and configured to receive the data from the signal reception unit and to output inverted data;
a data latch unit coupled to an output terminal of the first circuit unit and configured to latch the data and the inverted data;
a second circuit unit configured to receive the inverted data from the data latch unit and output the data; and
a third circuit unit configured to receive the data from the data latch unit and output the inverted data.

6. The data input/output circuit according to claim 5, wherein the data delivery unit further comprises:
a fourth circuit unit configured to receive the data from the second circuit unit and generate first inverted data and first non-inverted data; and
a fifth circuit unit configured to receive the inverted data from the third circuit unit and generate second inverted data and second non-inverted data.

7. The data input/output circuit according to claim 6, wherein the data delivery unit further comprises:
a sixth circuit unit configured to receive the first inverted data and the first non-inverted data from the fourth circuit unit, and pull up and pull down a first internal input/output line; and
a seventh circuit unit configured to receive the second inverted data and the second non-inverted data from the fifth circuit unit, and pull up and pull down a second internal input/output line.

8. The data input/output circuit according to claim 7, wherein the sixth circuit unit is configured to:
pull up the first internal input/output line based on the data input enable signal at a high level and the first non-inverted data at a high level, and
pull down the first internal input/output line based on the data input enable signal at a high level and the first inverted data at a high level.

9. The data input/output circuit according to claim 7, wherein the seventh circuit unit is configured to:
pull up the second internal input/output line based on data input enable signal at a high level and the second inverted data at a high level, and
pull down the second internal input/output line based on the data input enable signal at a high level and the second non-inverted data at a high level.

10. The data input/output circuit according to claim 7, further comprising:
a first initialization transistor configured to initialize a voltage on an output terminal of the fourth circuit unit based on an initialization signal; and
a second initialization transistor configured to initialize a voltage on an output terminal of the fifth circuit unit based on the initialization signal.

11. The data input/output circuit according to claim 2, wherein the signal reception unit outputs a result of an AND operation on the data input enable signal and data appearing on the input/output line.

12. The data input/output circuit according to claim 11, wherein the signal reception unit comprises an AND gate.

13. The data input/output circuit according to claim 11, wherein the signal reception unit comprises a NAND gate and an inverter.

14. The data input/output circuit according to claim 5, wherein each of the first circuit unit, the second circuit unit, and the third circuit unit functions as an inverter based on a first clock signal provided from external control logic of the data input/output circuit and a second clock signal that is an inverted signal of the first clock signal.

15. The data input/output circuit according to claim 14, further comprising at least one inverter configured to generate the second clock signal by inverting the first clock signal.

16. A semiconductor memory device, comprising:
a memory cell array including a plurality of memory cells;
a page buffer coupled to bit lines of the memory cell array;
a column decoder coupled to the page buffer;
a data input/output circuit coupled to the column decoder and an input/output line, and configured to receive input data from the input/output line to the page buffer and to provide output data from the page buffer to the input/output line; and control logic configured to control operation of the page buffer, the column decoder, and the data input/output circuit, wherein the data input/output circuit comprises:

a data output unit configured to output the output data received from the page buffer to the input/output line, based on a data output enable signal received from the control logic; and a data input unit configured to deliver input data received from the input/output line to the page buffer, based on a data input enable signal received from the control logic, and wherein the data input unit comprises:

a signal reception unit coupled to the input/output line and configured to receive the input data from the input/output line, based on the data input enable signal; and a data delivery unit configured to deliver the input data inputted to the signal reception unit to the page buffer, based on the data input enable signal, wherein the signal reception unit outputs a constant voltage value regardless of the output data appearing on the input/output line, based on the data input enable signal having a low-level voltage value during the data output period.

17. The semiconductor memory device according to claim 16, wherein the signal reception unit performs a logical operation on the data input enable signal and data appearing on the input/output line, and delivers a result of the logical operation to the data delivery unit.

18. The semiconductor memory device according to claim 17, wherein the data appearing on the input/output line data output period is the output data outputted from the page buffer, wherein the data appearing on the input/output line during the data input period is the input data inputted from outside through the input/output line, and wherein the signal reception unit is configured to output a low-level voltage value, regardless of the output data appearing on the input/output line, based on the data input enable signal maintained at a low level during the data output period.

19. The semiconductor memory device according to claim 17, wherein the data appearing on the input/output line during the data output period is the output data outputted from the page buffer, wherein the data appearing on the input/output line during the data input period is the input data inputted from outside through the input/output line, wherein the data input enable signal is maintained at a high level during the data input period, and wherein the signal reception unit is configured to output the input data appearing on the input/output line, based on the data input enable signal maintained at a high level during the data input period.

20. The semiconductor memory device according to claim 16, wherein the data delivery unit comprises:

a first circuit unit coupled to an output terminal of the signal reception unit and configured to receive the data from the signal reception unit and to output inverted data;

a data latch unit coupled to an output terminal of the first circuit unit and configured to latch the data and the inverted data;

a second circuit unit configured to receive the inverted data from the data latch unit and output the data;

a third circuit unit configured to receive the data from the data latch unit and output the inverted data;

a fourth circuit unit configured to receive the data from the second circuit unit and generate first inverted data and first non-inverted data;

a fifth circuit unit configured to receive the inverted data from the third circuit unit and generate second inverted data and second non-inverted data;

a sixth circuit unit configured to receive the first inverted data and the first non-inverted data from the fourth circuit unit, and pull up and pull down a first internal input/output line; and a seventh circuit unit configured to receive the second inverted data and the second non-inverted data from the fifth circuit unit, and pull up and pull down a second internal input/output line.

* * * * *